(12) United States Patent
Hashimoto et al.

(10) Patent No.: US 6,990,031 B2
(45) Date of Patent: Jan. 24, 2006

(54) SEMICONDUCTOR MEMORY DEVICE CONTROL METHOD AND SEMICONDUCTOR MEMORY DEVICE

(75) Inventors: Takeshi Hashimoto, Tokyo (JP); Yutaka Ito, Tokyo (JP)

(73) Assignee: Elpida Memory, Inc. (JP)

(*) Notice: Subject to any disclaimer, the term of this patent is extended or adjusted under 35 U.S.C. 154(b) by 606 days.

(21) Appl. No.: 10/231,794

(22) Filed: Aug. 29, 2002

(65) Prior Publication Data

US 2003/0043673 A1 Mar. 6, 2003

(30) Foreign Application Priority Data

Sep. 3, 2001 (JP) .................................. 2001-265800

(51) Int. Cl.
*G11C 7/00* (2006.01)

(52) U.S. Cl. .................. 365/222; 365/189.09; 365/226; 365/227

(58) Field of Classification Search ................ 365/222, 365/226, 227, 189.09
See application file for complete search history.

(56) References Cited

U.S. PATENT DOCUMENTS

| | | | | |
|---|---|---|---|---|
| 5,333,128 A | * | 7/1994 | Yoon et al. | ................. 365/222 |
| 6,038,186 A | * | 3/2000 | Tanizaki | ..................... 365/222 |
| 6,185,137 B1 | * | 2/2001 | Sato et al. | .................. 365/200 |
| 6,229,747 B1 | * | 5/2001 | Cho et al. | .................... 365/222 |
| 6,611,472 B2 | * | 8/2003 | Kitamoto et al. | ........... 365/227 |

FOREIGN PATENT DOCUMENTS

| | | |
|---|---|---|
| JP | 08-203268 | 8/1996 |
| JP | 11-120772 | 4/1999 |
| KR | 2000-0043211 | 7/2000 |

* cited by examiner

*Primary Examiner*—Tan T. Nguyen
(74) *Attorney, Agent, or Firm*—Hayes Soloway P.C.

(57) ABSTRACT

In a semiconductor memory device which requires a refresh operation, a control method stops supplying a word line voltage which is a boosted voltage higher than an external supply voltage, a memory array substrate voltage which is a negative voltage supplied to a semiconductor substrate, and a bit line precharge voltage for use in reproducing data held in memory cells for a predetermined period at the end of each refresh operation. In this event, voltage output terminals of the word line and memory array substrate voltages are respectively driven to a ground potential. For recovering these voltages, the delivery of the word line voltage is stopped until the memory array substrate voltage rises to some extent.

22 Claims, 11 Drawing Sheets

SEMICONDUCTOR MEMORY DEVICE CONTROL METHOD AND SEMICONDUCTOR MEMORY DEVICE

BACKGROUND OF THE INVENTION

1. Field of the Invention

The present invention relates to a semiconductor memory device control method suitable for application in DRAM (Dynamic Random Access Memory) which requires a refresh operation, and a semiconductor memory device.

2. Description of the Related Art

Recent semiconductor memory devices such as DRAM are used as well in mobile terminal devices such as portable telephones, PDA (Personal Digital Assistance), and the like, so that a reduction in current consumption is increasingly required for the semiconductor memory devices.

As a means for realizing a reduction in current consumption, Japanese Patent Application Laid-open No. 8-203268, for example, discloses a technique which places bit lines in a floating state in a non-access period for memory cells which hold data to eliminate leak currents flowing through bit lines and sense amplifiers connected thereto, thereby reducing the current consumption. The non-access period refers to a period which excludes a data read, a data write, and a refresh operation period. The refresh operation in turn refers to the operation for holding data written in memory cells by reading, amplifying, and rewriting the data every predetermined time.

DRAM is so structured as to hold data therein by accumulating charges on capacitors included in memory cells. With this structure, DRAM requires the refresh operation for reading data from the memory cells and rewriting the data into the memory cells within maximal data hold time tREFmax for which the memory cells can hold the data written therein. Average current consumption of DRAM depends on tREFmax, so that as DRAM has longer tREFmax, DRAM can reduce the number of times the refresh operation should be performed to result in a reduction in average current consumption.

However, even if the performance of memory cells and the like is improved to extend maximal data hold time tREFmax, the average current consumption cannot be reduced more after maximal data hold time tREFmax has reached a certain length. This is attributed to a current consumed by peripheral circuits, and the existence of a DC current component such as a leak current which flows into defective sites that were unintentionally fabricated in DRAM during the manufacturing.

As a result of increasingly higher integration of DRAM, a memory array unit of DRAM including a memory cell array comprising memory cells arranged in matrix, word drivers for driving word lines, sense amplifiers for reading data held in the memory cell array, and the like is processed for further miniaturization, as compared with peripheral circuits of DRAM. Thus, the highly miniaturized memory array unit suffers from a larger number of defects, such as short-circuit between adjacent lines, and the like, as compared with the peripheral circuits, resulting in the consumption of a current from an external power supply due to leak currents which may have been generated at these defective sites. Stated another way, a reduction in leak current is effective to a reduction in average current consumption.

As described above, in DRAM described in Japanese Patent Application Laid-open No. 8-203268, since bit lines are placed in a floating state during a non-access period, it is possible to cut off leak currents flowing through the bit lines and sense amplifiers connected thereto.

However, a problem still remains in that average current consumption cannot be sufficiently reduced for overall DRAM because the bit lines placed in the floating state alone fail to reduce leak currents flowing through word lines and current consumption in the peripheral circuits and the like.

SUMMARY OF THE INVENTION

It is therefore an object of the present invention to provide a semiconductor memory device control method and a semiconductor memory device which are capable of further reducing average current consumption.

Recent semiconductor memory devices do not use external supply voltage VDD, as it is, supplied from the outside, but generate predetermined internal supply voltages using an internal voltage generator circuit for reducing or boosting external supply voltage VDD, and supply the thus generated internal supply voltages to internal circuits to improve the reliability of the devices.

For example, in DRAM, transistors used for memory cells are largely reduced in size for increasing the storage capacity. With this reduction in size, the resulting transistors cannot have a high voltage applied, so that DRAM is provided therein with a voltage reduction power supply circuit for supplying the transistors with a reduced voltage lower than external supply voltage VDD.

On the other hand, a boosted voltage higher than external supply voltage VDD must be supplied to word lines in order to ensure desired performance. Further, a semiconductor substrate may be biased to a negative voltage in order to improve the charge holding characteristic of memory cells. In this manner, a semiconductor memory device contains internal voltage generator circuits for generating a variety of internal supply voltages.

The present invention provides a method of stopping the operation of the internal voltage generator circuits for generating the internal supply voltages in a non-access period in which a memory array unit is not accessed.

The present invention also provides a semiconductor memory device which has a means for stopping the operation of internal voltage generator circuits for generating internal supply voltages in a non-access period in which a memory array unit is not accessed. However, the means does not stop the operation of internal voltage generator circuits which are required to hold data stored in memory cells.

Specifically, in a period from the end of a refresh operation to the start of the next refresh operation, the means stops the operation of respective internal voltage generator circuits for generating word line voltage VPP which is a boosted voltage for use in driving a word line; memory array substrate voltage VBB which is a negative voltage supplied to a semiconductor substrate; and bit line precharge voltage VBLR for use in reproducing data held in the memory cells.

On the other hand, the means does not stop the operation of internal voltage generator circuits for generating a cell plate voltage VPLT which is a reduced voltage supplied to an upper electrode of a capacitor provided in each memory cell for holding data, and a reduced voltage VCL supplied to peripheral circuits. For stopping (cutting off) the delivery of word line voltage VPP, memory array substrate voltage VBB, and bit line precharge voltage VBLR, the means together may also stop the delivery of bit line voltage VDL which is a reduced voltage for use in driving a bit line.

The method of controlling a semiconductor memory device and the semiconductor memory device as described above can reduce average current consumption of the semiconductor memory device since they can cut off a leak current flowing through word lines, and leak currents flowing into loads of internal voltage generator circuits, the operation of which is stopped. This is accomplished by stopping the supply of word line voltage VPP which is a boosted voltage higher than the external supply voltage; memory array substrate voltage VBB which is a negative voltage supplied to a semiconductor substrate; or bit line precharge voltage VBLR for use in reproducing data held in the memory cells for a predetermined period at the end of each refresh operation.

Also, when an output terminal of memory array substrate voltage VBB, and word lines are connected respectively to a ground potential while these voltage outputs are stopped, transistors contained in the memory cells are prevented from malfunctions, thus avoiding corruption of data held in the memory cells.

Further, when word line voltage VPP is delivered from the VPP internal voltage generator circuit after memory array substrate voltage VBB delivered from the VBB internal voltage generator circuit has risen, the transistors in the memory cells are prevented from malfunctions when these voltages are recovered, thus avoiding corruption of data held in the memory cells.

The above and other objects, features and advantages of the present invention will become apparent from the following description with reference to the accompanying drawings which illustrate examples of the present invention.

DETAILED DESCRIPTION OF THE PREFERRED EMBODIMENTS (First Embodiment)

Figure 1:
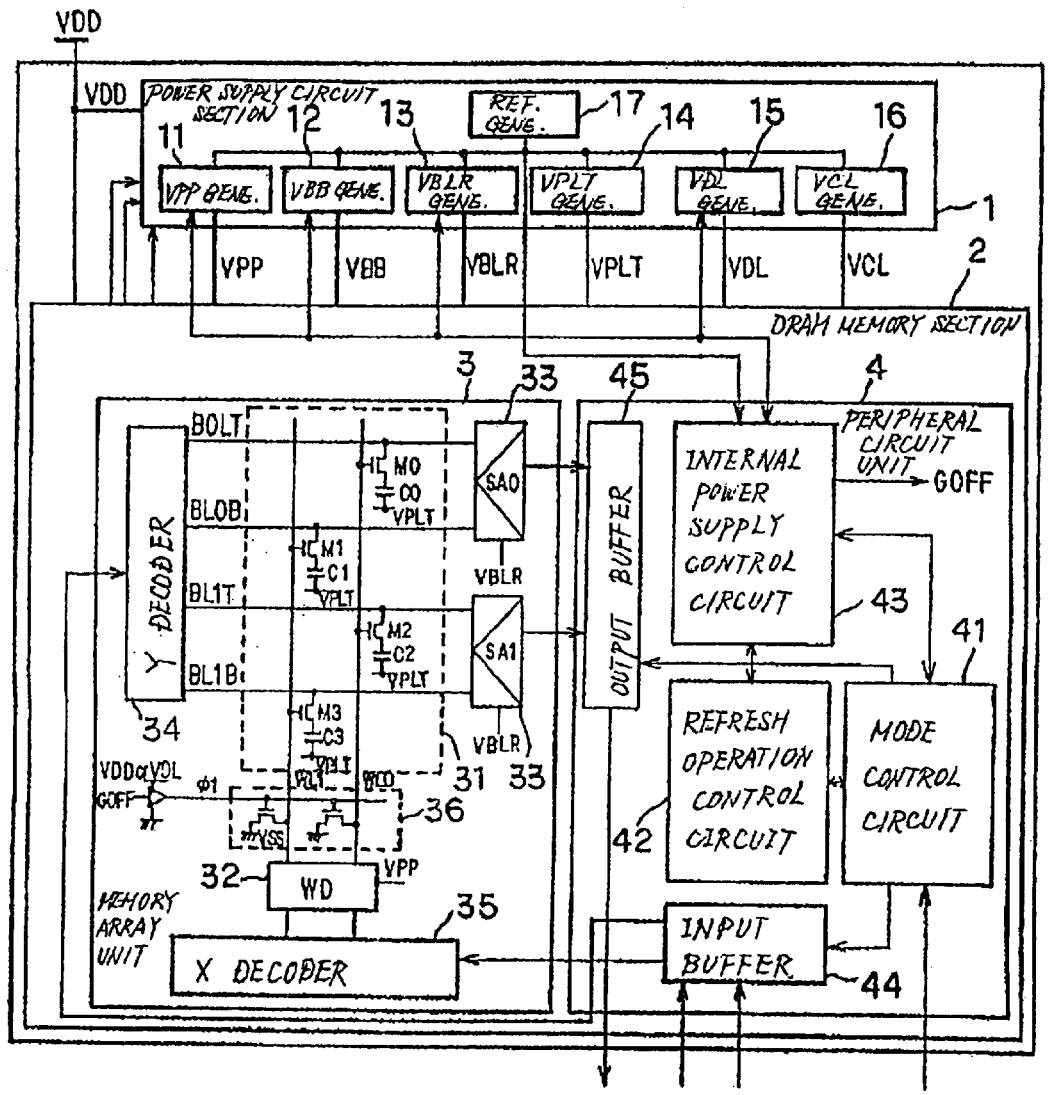
FIG. 1 is a block diagram illustrating the configuration of a semiconductor memory device according to the present invention in a first embodiment.

FIG. 1 illustrates the configuration of a semiconductor memory device according to the present invention in a first embodiment. Specifically, FIG. 1 illustrates an exemplary configuration of DRAM.

As illustrated in FIG. 1, the semiconductor memory device in the first embodiment comprises power supply circuit section 1 including internal voltage generator circuits respectively for generating predetermined internal supply voltages; and DRAM memory section 2 including a memory array unit for holding data and a control circuit therefor.

Power supply circuit section 1 comprises VPP internal voltage generator circuit 11 (VPP GENE.) for generating word line voltage VPP; VBB internal voltage generator circuit 12 (VBB GENE.) for generating memory array substrate voltage VBB; VBLR internal voltage generator circuit 13 (VBLR GENE.) for generating bit line precharge voltage VBLR; VPLT internal voltage generator circuit 14 (VPLT GENE.) for generating cell plate voltage VPLT; VDL internal voltage generator circuit 15 (VDL GENE.) for generating bit line voltage VDL; VCL internal voltage generator circuit 16 (VCL GENE.) for generating reduced voltage VCL for peripheral circuits; and reference voltage generator circuit 17 (REF. GENE.) for generating a reference voltage for generating the respective internal supply voltages.

DRAM memory section 2 comprises memory array unit 3 for storing data; and peripheral circuit unit 4 for conducting a control to read and write data from and into memory array unit 3.

Memory array unit 3 comprises memory cell array 31 comprised of a plurality of memory cells arranged in matrix; word driver (WD) 32 for driving word lines; sense amplifier 33 for reading data stored in memory cells; and Y decoder 34 and X decoder 35 for decoding an address to access a memory cell with which data is written/read. A memory cell comprises a capacitor (C0–C3 in FIG. 1) for holding data and MOS transistors (M0–M3 in FIG. 1) which are switching elements, connected in series, and is supplied with cell plate voltage VPLT from one end of the capacitor. The semiconductor memory device in the first embodiment further comprises switch unit 36 in memory array unit 3 for connecting associated word lines to ground potential VSS to prevent the transistors, which form part of the memory cells, from malfunctioning during an inoperative period of the internal voltage generator circuits. Switch unit 36 is controlled ON/OFF in response to an internal power supply stop signal GOFF supplied from an internal power supply control circuit, later described. While FIG. 1 only shows four bit lines (BL0T, BL0B, BL1T, BL1B), two word lines (WL0, WL1), and two sense amplifiers (SA0, SA1) in memory array unit 3 for simplification, actual memory array unit 3 has larger numbers of bit lines, word lines, and sense amplifiers.

Peripheral circuit unit 4 comprises mode control circuit 41 for setting the semiconductor memory device in a predetermined operation mode in response to a control command fed from the outside; refresh operation control circuit 42 for controlling a refresh operation; internal power supply control circuit 43 for generating a control signal for controlling a variety of internal voltage generator circuits contained in power supply circuit section 1 to be operative/inoperative; input buffer 44 for temporarily holding an address and data fed from the outside; and output buffer 45 for temporarily holding output data read from memory array unit 3.

Mode control circuit 41 decodes a control command fed from the outside, and sets the semiconductor memory device in a predetermined operation mode in accordance with the result of decoding. Refresh operation control circuit 42 in turn generates refresh operation signal SRFT indicative of a refresh operation period; refresh end pulse REFENDP indicative of the end of a refresh operation; and word line selection pulse PSRF for selecting a word line to be accessed in a refresh operation every predetermined period. These signals are required to control the refresh operation. Since mode control circuit 41 and refresh operation control circuit 42 may be built respectively using known logical circuits, description thereon is herein omitted.

Figure 2:
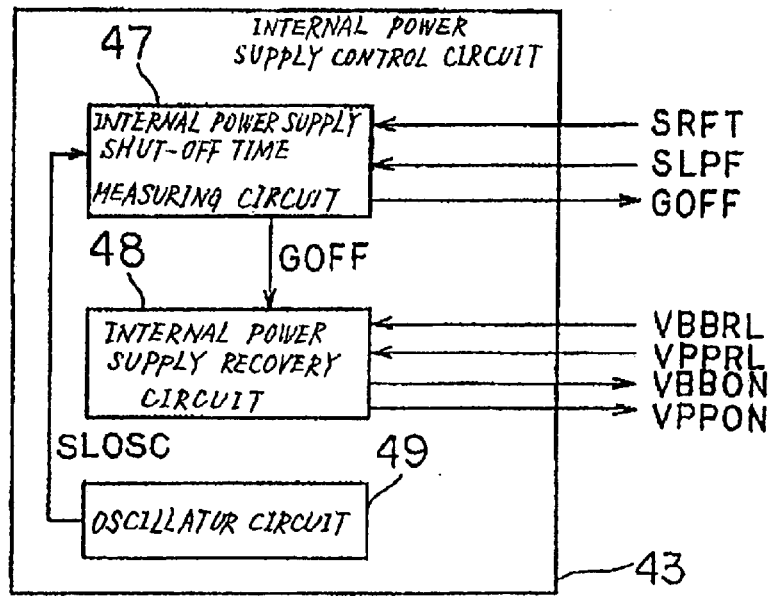
FIG. 2 is a block diagram illustrating an exemplary configuration of an internal power supply control circuit shown in FIG. 1.

As illustrated in FIG. 2, internal power supply control circuit 43 comprises internal power supply cut-off time measuring circuit 47 for generating internal power supply stop signal GOFF for controlling the internal voltage generator circuits to be inoperative/operative; internal power supply recovery circuit 48 for generating a control signal for recovering a variety of internal voltage generator circuits, which have been made inoperative, in a predetermined order; and oscillator circuit 49 for generating a pulse at a constant cycle.

In the semiconductor memory device of the first embodiment, an output terminal of VBB internal voltage generator circuit 12 is connected to ground potential VSS to prevent a substrate voltage from floating to a positive potential when memory array substrate voltage VBB, which is a negative voltage, is not supplied. This connection is made because the substrate voltage at a positive potential could induce a malfunction due to a reduced threshold voltage of transistors in memory cells or a malfunction due to forward biasing relative to pn junctions of the transistors to corrupt data stored in the memory cells.

Also, in the semiconductor memory device of the first embodiment, internal power supply recovery circuit 48 generates a control signal to raise word line voltage VPP after memory array substrate voltage VBB has risen to some extent in order to prevent the substrate voltage from floating to a positive potential when the internal voltage generator circuits are recovered.

Figure 3:
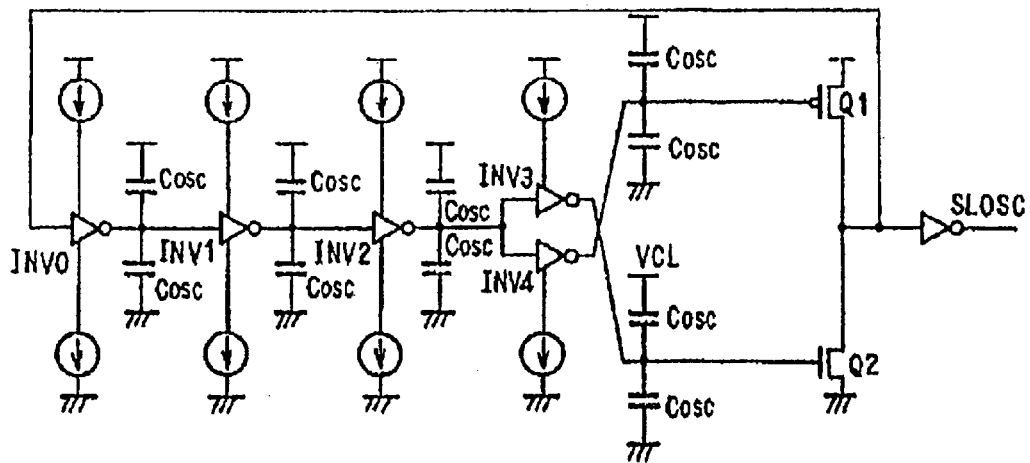
FIG. 3 is a circuit diagram illustrating an exemplary configuration of an oscillator circuit shown in FIG. 2.

Oscillator circuit 49 is, for example, a ring oscillator which oscillates through self excitation by amplifying the output of a plurality of inverters (INV0–INV4 in FIG. 3) connected in multiple stages by transistors Q1, Q2, and feeding back the output to the inverter (INV0) at the first stage, as illustrated in FIG. 3. Inverters INV0–INV4 are each powered through respective current sources. Capacitors COSC are inserted between an output terminal and a power supply terminal of each inverter INV0–INV4 and between an output terminal and a ground potential of each inverter INV0–INV4, respectively, for determining the oscillating frequency. In the alternative, oscillator circuit 49 may be provided in refresh operation control circuit 42 described above.

Figure 4:
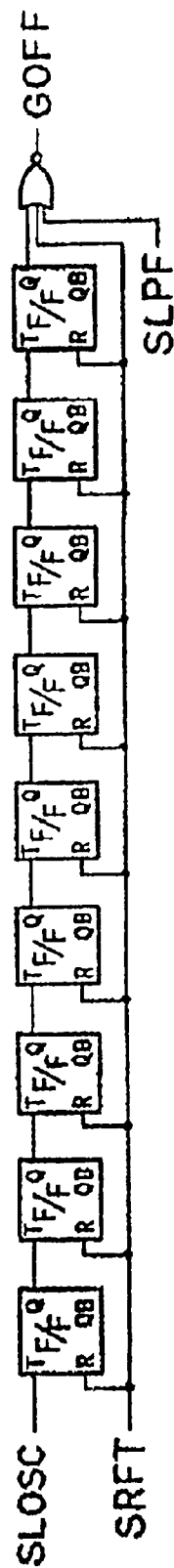
FIG. 4 is a circuit diagram illustrating an exemplary configuration of an internal power supply cut-off time measuring circuit shown in FIG. 2.

Internal power supply cut-off time measuring circuit 47 comprises, for example, a counter circuit which includes a plurality of flip-flops (F/F) connected in series for counting a predetermined number of output pulses SLOSC from oscillator circuit 49, as illustrated in FIG. 4. The counter circuit starts counting output pulses SLOSC from oscillator circuit 49 when refresh operation signal SRFT, indicative of a refresh operation period, switches to "L" level, for generating internal power supply stop signal GOFF having a predetermined pulse width (which is set as appropriate in accordance with maximal hold time tREFmax, for example, to 1 sec). Internal power supply stop signal GOFF is delivered only when self refresh mode signal SLPF is at "L" level. Self refresh mode signal SLPF indicates a self refresh mode in which the semiconductor memory device repeatedly performs the refresh operation and stops the internal voltage generator circuits. As described above, refresh operation signal SRFT is transmitted from refresh operation control circuit 42, while self refresh mode signal SLPF is transmitted from mode control circuit 41.

Figure 5:
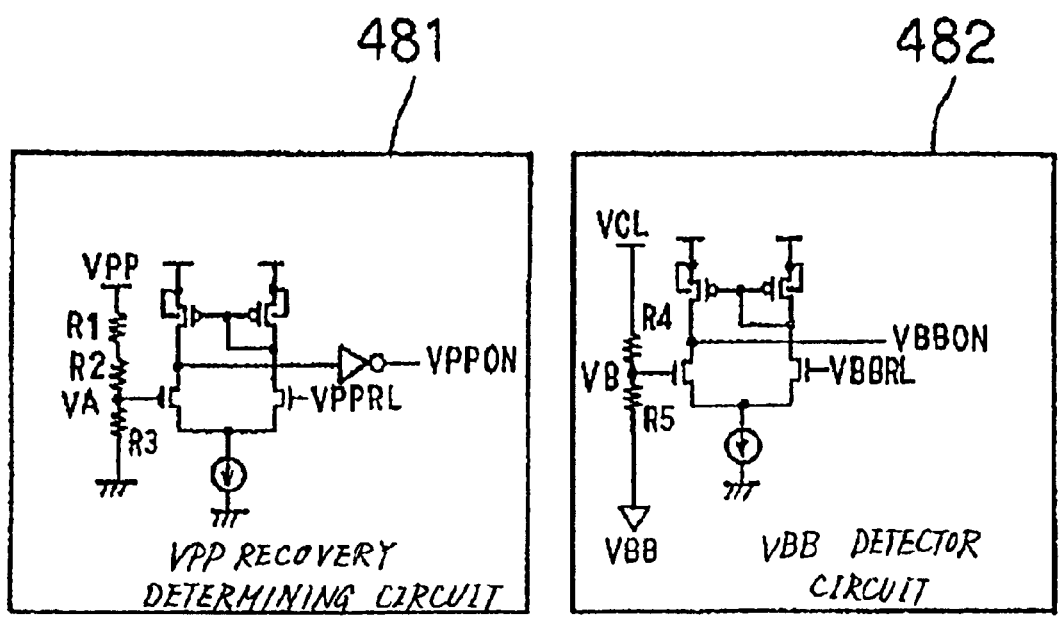
FIG. 5 is a circuit diagram illustrating an exemplary configuration of an internal power supply recovery circuit shown in FIG. 2.

As illustrated in FIG. 5, internal power supply recovery circuit 48 comprises VPP recovery determining circuit 481 for determining whether or not word line voltage VPP has been completely recovered; and VBB detector circuit 482 for detecting whether or not memory array substrate voltage VBB has risen to a predetermined voltage.

VPP recovery determining circuit 481 comprises three resistors R1–R3 inserted in series between word line voltage VPP and ground potential VSS; and a differential circuit for comparing voltage VA at a connection node at which resistors R2, R3 are connected with reference voltage VPPRL. The differential circuit switches VPP recovery signal VPPON to a significant value (for example, "H") when node voltage VA exceeds reference voltage VPPRL.

VBB detector circuit 482 comprises two resistors R4, R5 inserted in series between peripheral circuit reduced voltage VCL and memory array substrate voltage VBB; and a differential circuit for comparing voltage VB at a connection node at which resistors R4, R5 are connected with reference voltage VBBRL. The differential circuit switches VBB rise completion signal VBBON to a significant value (for example, "H") when node voltage VB exceeds reference voltage VBBRL. Reference voltages VPPRL, VBBRL are supplied respectively from reference voltage generator circuit 17 shown in FIG. 1. Resistors R1–R3 form a circuit for dividing word line voltage VPP, while resistors R4, R5 form a circuit for dividing a voltage VCL+VBB. Therefore, these circuits are not limited in configurations to those illustrated in FIG. 5, but may be formed of two or three or more resistors.

Next, the configuration of the internal voltage generator circuits contained in power supply circuit section 1 shown in FIG. 1 will be described with reference to the drawings. It should be noted that the internal voltage generator circuits are not limited to circuit configurations described below, but any circuits may be used as long as they can generate a predetermined reduced voltage, boosted voltage, or negative voltage.

Reference voltage generator circuit 17 may be formed of a known circuit which can generate a predetermined voltage that barely fluctuates in response to a change in a surrounding environment (temperature). Therefore, description on the configuration and operation of reference voltage generator circuit 17 is herein omitted.

Figure 6:
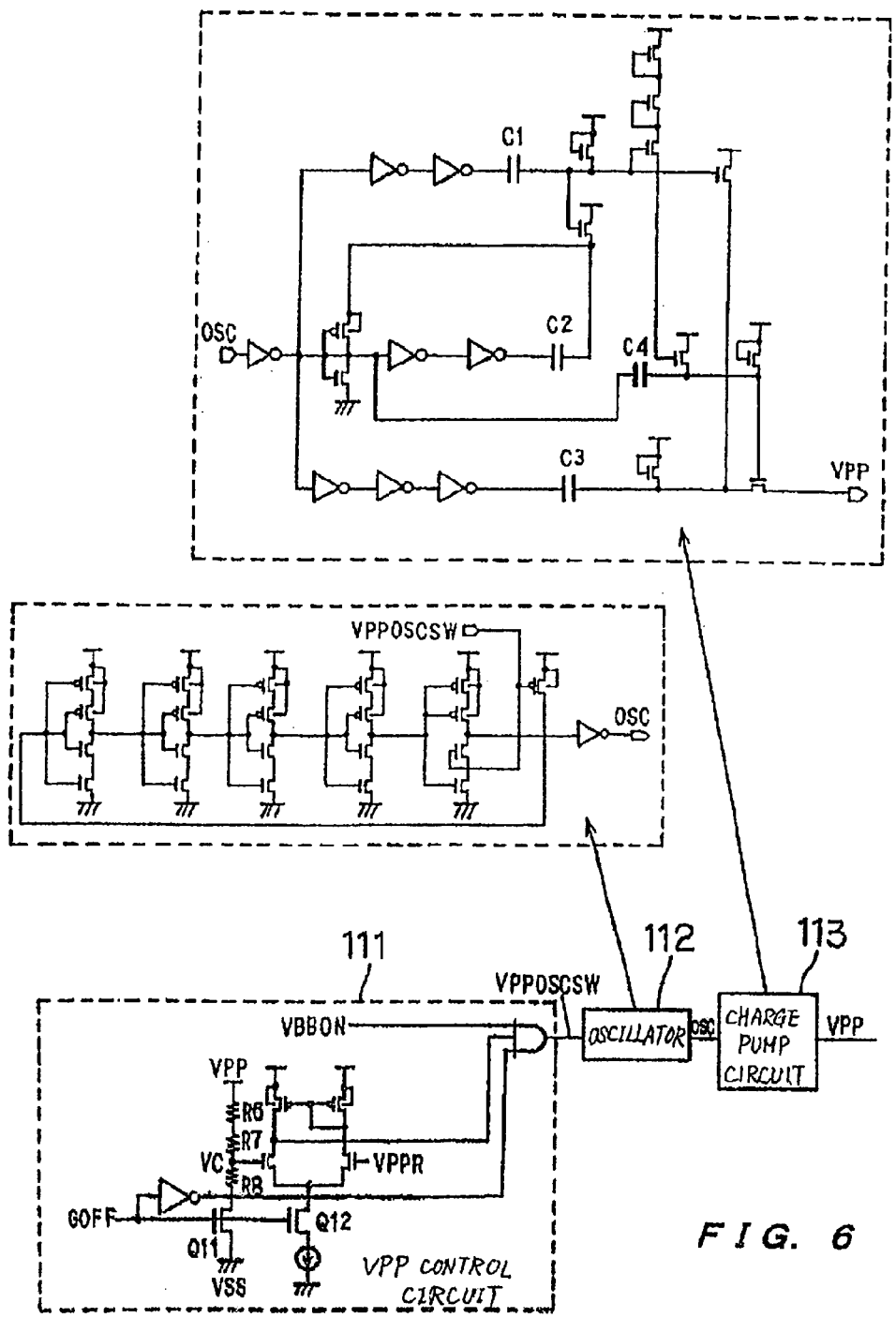
FIG. 6 is a circuit diagram illustrating an exemplary configuration of a VPP internal voltage generator circuit shown in FIG. 1.

As illustrated in FIG. 6, VPP internal voltage generator circuit 11, which comprises VPP control circuit 111; oscillator 112; and charge pump circuit 113, is configured to generate a boosted voltage higher than external supply voltage VDD by adding an output pulse of oscillator 112 in the positive voltage direction by charge pump circuit 113 for rectification. Output voltage (VPP) of charge pump circuit 113 is fed back to VPP control circuit 111 to oscillate/stop oscillator 112 in accordance with the value of the output voltage, thereby controlling word line voltage VPP to be constant.

VPP control circuit 111 comprises three resistors R6–R8 inserted in series between word line voltage VPP and ground potential VSS; and a differential circuit for comparing voltage VC at a connection node at which resistors R7, R8 are connected with reference voltage VPPR. The differential circuit stops the oscillation of oscillator 112 by oscillation control signal VPPOSCSW when node voltage VC exceeds reference voltage VPPR, and resumes the oscillation of oscillator 112 when node voltage VC is lower than reference voltage VPPR.

VPP control circuit 111 also comprises switching transistor Q11 for cutting off between resistor R8 and ground potential; and switching transistor Q12 for cutting off between two transistors, which constitute a differential pair of a comparator circuit, and a current source. Switching transistors Q11, Q12 are controlled ON/OFF by internal power supply stop signal GOFF delivered from internal power supply cut-off time measuring circuit 47. VPP control circuit 111 further comprises a gate circuit for controlling oscillation control signal VPPOSCSW in response to VBB rise completion signal VBBON delivered from internal power supply recovery circuit 48, and to internal power supply stop signal GOFF. VPP control circuit 111 stops the oscillation of oscillator 112 with oscillation control signal VPPOSCSW when internal power supply stop signal GOFF is at "H", and stops the oscillation of oscillator 112 with oscillation control signal VPPOSCSW while memory array substrate voltage VBBON is at "L". VPP control circuit 111 configured in this manner can control the order of recovery of aforementioned memory array substrate voltage VBB and word line voltage VPP when the internal voltage generator circuits are recovered.

Oscillator 112 is a ring oscillator which comprises a plurality of inverter circuits, each formed of nMOS transistors and pMOS transistors, in multiple stages, and oscillates through self excitation by feeding back the output of the final stage to the input of the first stage.

Charge pump circuit 113 comprises a plurality of inverters, a plurality of boosting capacitors (C1–C4 in FIG. 6), and a plurality of switching elements for adding output voltages of the respective boosting capacitors at a predetermined timing. Charge pump circuit 113 delivers a boosted voltage in response to a clock supplied thereto from oscillator 112, and stops delivering the boosted voltage when the clock is stopped.

Figure 7:
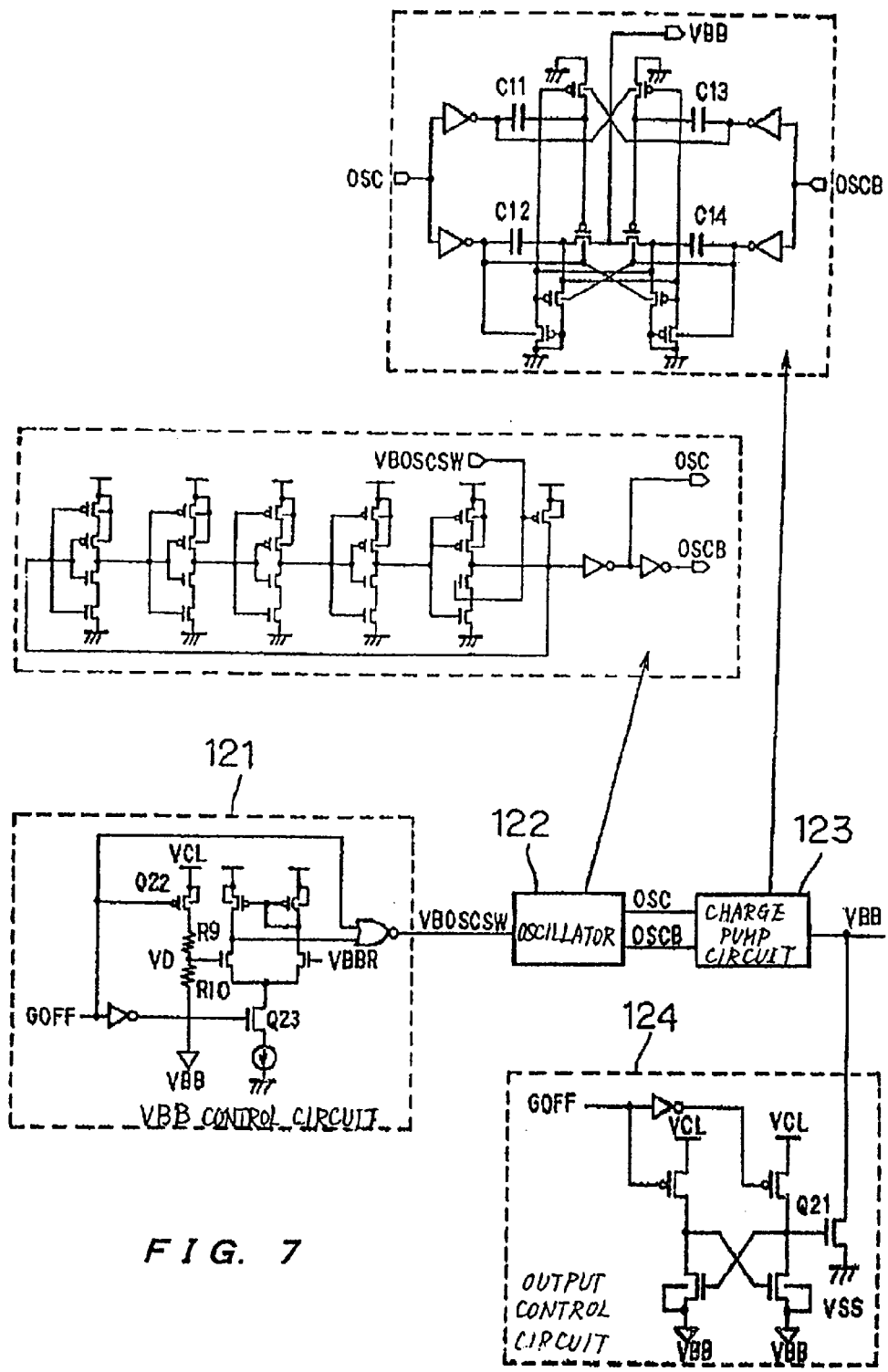
FIG. 7 is a circuit diagram illustrating an exemplary configuration of a VBB internal voltage generator circuit shown in FIG. 1.

As illustrated in FIG. 7, VBB internal voltage generator circuit 12, which comprises VBB control circuit 121, oscillator 122, and charge pump circuit 123, is configured to generate a negative voltage by adding an oscillating output pulse from oscillator 122 in the negative voltage direction by charge pump circuit 123 for rectification. Output voltage (VBB) of charge pump circuit 123 is fed back to VBB control circuit 121, such that memory array substrate voltage VBB is controlled to be constant by oscillating/stopping oscillator 122 in accordance with the value of the output voltage.

VBB internal voltage generator circuit 12 also comprises output control circuit 124 for connecting an output terminal of VBB internal voltage generator circuit 12 to ground potential VSS in order to prevent a substrate voltage from floating to a positive potential when memory array substrate voltage VBB is not supplied. Output control circuit 124 comprises switching transistor Q21 inserted between an output terminal of charge pump circuit 123 and ground potential VSS, and switching transistor Q21 is controlled ON/OFF by internal power supply stop signal GOFF delivered from internal power supply cut-off time measuring circuit 47.

VBB control circuit 121 comprises two resistors R9, R10 inserted in series between peripheral circuit boosted voltage VCL and memory array substrate voltage VBB; and a differential circuit for comparing voltage VD at a connection node at which resistors R9, R10 are connected with reference voltage VBBR. The differential circuit stops the oscillation of oscillator 122 with oscillation control signal VBBOSCSW when node voltage VD exceeds reference voltage VBBR, and resumes the oscillation of oscillator 122 when node voltage VD is lower than reference voltage VBBR.

VBB control circuit 121 also comprises switching transistor Q22 for cutting off between resistor R9 and peripheral circuit reduced voltage VCL; and switching transistor Q23 for cutting off between two transistors, which form a differential pair of a comparator circuit, and a current source. Switching transistors Q22, Q23 are controlled ON/OFF by internal power supply stop signal GOFF delivered from internal power supply cut-off time measuring circuit 47. VBB control circuit 121 stops the oscillation of oscillator 122 with oscillation control signal VBBOSCSW when switching transistors Q22, Q23 are both OFF.

Oscillator 122 comprises a plurality of inverter circuits, each formed of nMOS transistors and pMOS transistors, in multiple stages, and oscillates through self excitation by feeding back the output of the final stage to the input of the first stage.

Charge pump circuit 123, which receives oscillating output clock OSC from oscillator 122 and inverted output OSCB thereof, comprises a plurality of inverters; a plurality of voltage reduction capacitors (C11–C14 in FIG. 7); and a plurality of switching elements each for adding an output voltage of each voltage reduction capacitor at a predetermined timing. Charge pump circuit 123 delivers a negative voltage in response to the clock fed thereto from oscillator 122, and stops delivering the negative voltage when the clock fed thereto is stopped.

Figure 8:
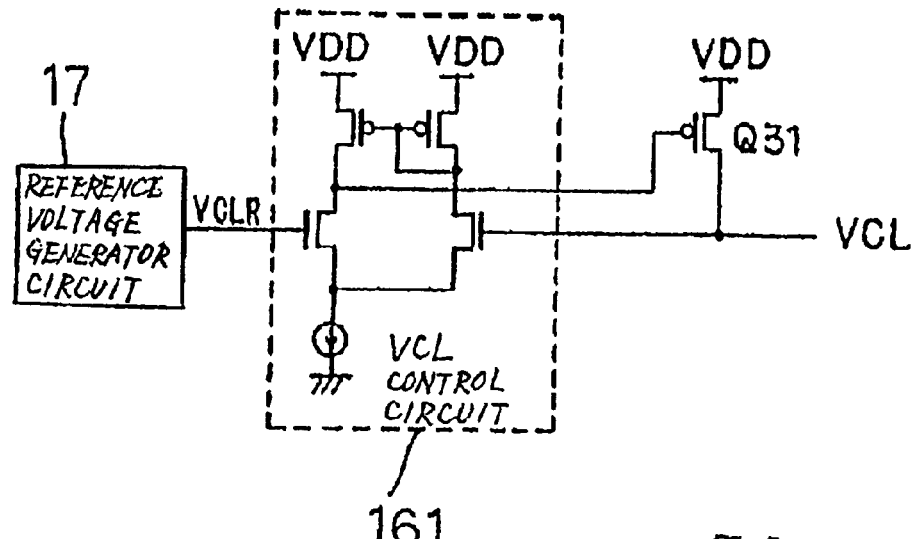
FIG. 8 is a circuit diagram illustrating an exemplary configuration of a VCL internal voltage generator circuit shown in FIG. 1.

As illustrated in FIG. 8, VCL internal voltage generator circuit 16 comprises output transistor Q31 for delivering peripheral circuit reduced voltage VCL; and VCL control circuit 161 having a differential amplifier for controlling peripheral circuit reduced voltage VCL to be constant. VCL control circuit 161 compares predetermined reference voltage VCLR supplied from reference voltage generator circuit 17 with peripheral circuit reduced voltage VCL delivered from output transistor Q31 to control output transistor Q31 such that peripheral circuit reduced voltage VCL equals reference voltage VCLR.

Figure 9:
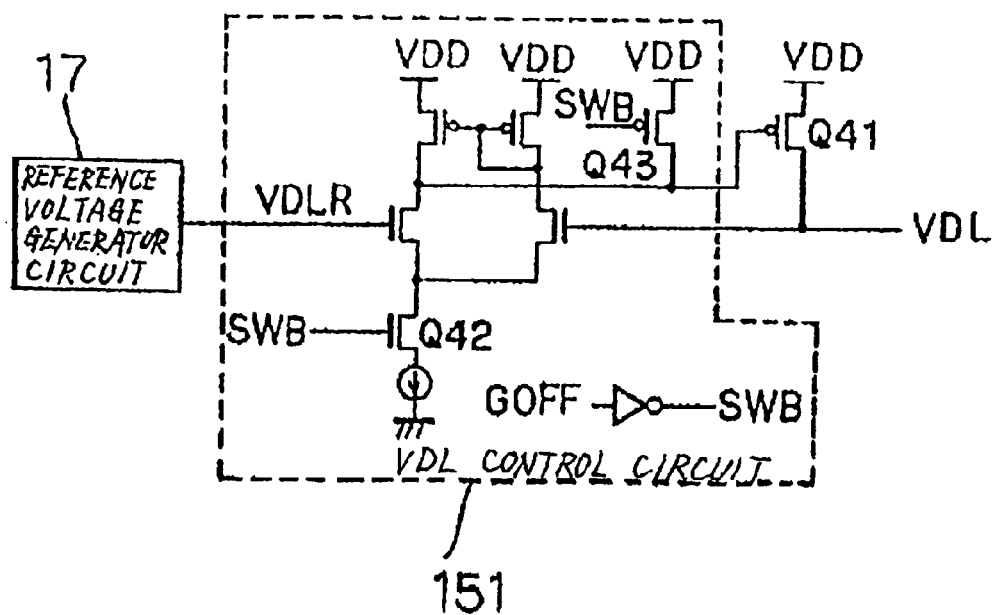
FIG. 9 is a circuit diagram illustrating an exemplary configuration of a VDL internal voltage generator circuit shown in FIG. 1.

As illustrated in FIG. 9, VDL internal voltage generator circuit 15 comprises output transistor Q41 for delivering bit line voltage VDL; and VDL control circuit 151 having a differential amplifier for controlling bit line voltage VDL to remain at a constant voltage. VDL control circuit 151 compares predetermined reference voltage VDLR supplied from reference voltage generator circuit 17 with bit line voltage VDL delivered from output transistor Q41 to control output transistor Q41 such that bit line voltage VDL equals reference voltage VDLR.

VDL internal voltage generator circuit 15 also comprises switching transistor Q42 for cutting off between a regulated current source for supplying a regulated current to the differential amplifier of VDL control circuit 151 and ground potential VSS; and switching transistor Q43 for fixing output transistor Q41 in OFF state. Switching transistors Q42, Q43 are controlled ON/OFF by control signal SWB which is generated by inverting internal power supply stop signal GOFF by an inverter.

Figure 10:
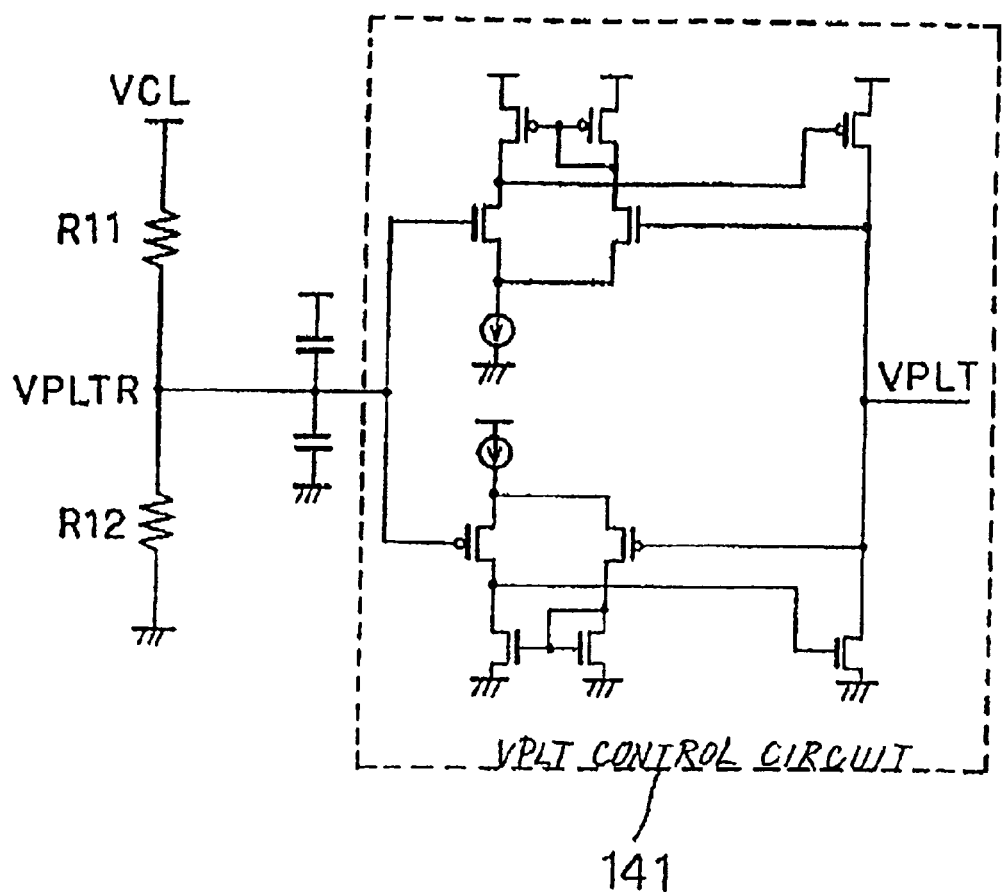
FIG. 10 is a circuit diagram illustrating an exemplary configuration of a VPLT internal voltage generator circuit shown in FIG. 1.

As illustrated in FIG. 10, VPLT internal voltage generator circuit 14 comprises resistors R11, R12 for dividing peripheral circuit reduced voltage VCL; and VPLT control circuit 141 which has two sets of a differential amplifier circuit and an output transistor for multiplying voltage VPLTR at a connection node at which resistors R11, R12 are connected by a predetermined factor to generate cell plate voltage VPLT. VPLT control circuit 141 compares node voltage VPLTR with cell plate voltage VPLT to control the respective output transistors such that cell plate voltage VPLT is higher than node voltage VPLTR by the predetermined factor.

Figure 11:
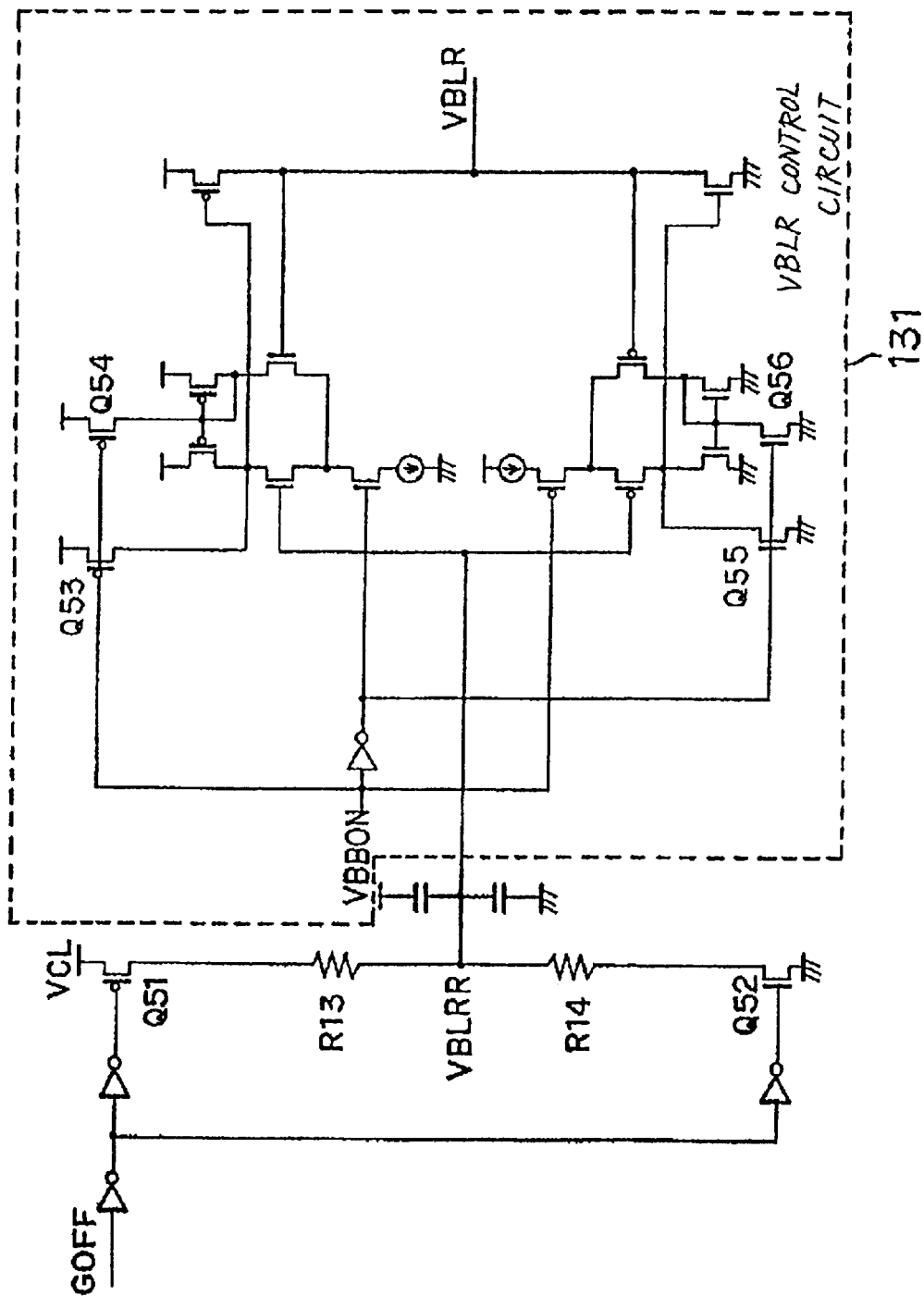
FIG. 11 is a circuit diagram illustrating an exemplary configuration of a VBLR internal voltage generator circuit shown in FIG. 1.

As illustrated in FIG. 11, VBLR internal voltage generator circuit 13 comprises resistors R13, R14 for dividing peripheral circuit reduced voltage VCL; and VBLR control circuit 131 which has two sets of a differential amplifier circuit and an output transistor for multiplying voltage VBLRR at a connection node at which resistors R13, R14 are connected by a predetermined factor to generate bit line precharge voltage VBLR. VBLR control circuit 131 compares node voltage VBLRR with bit line precharge voltage VBLR to control the respective output transistors such that bit line precharge voltage VBLR is higher than node voltage VBLRR by the predetermined factor.

VBLR internal voltage generator circuit 13 also comprises switching transistors Q51, Q52 for cutting off the delivery of node voltage VBLRR; and switching transistors Q53–Q56 for stopping the operation of the differential amplifiers and transistors of VBLR control circuit 131. Switching transistors Q51–Q56 are respectively controlled ON/OFF by internal power supply stop signal GOFF.

Next, the operation of the semiconductor memory device in the first embodiment will be described with reference to FIG. 12.

Figure 12:
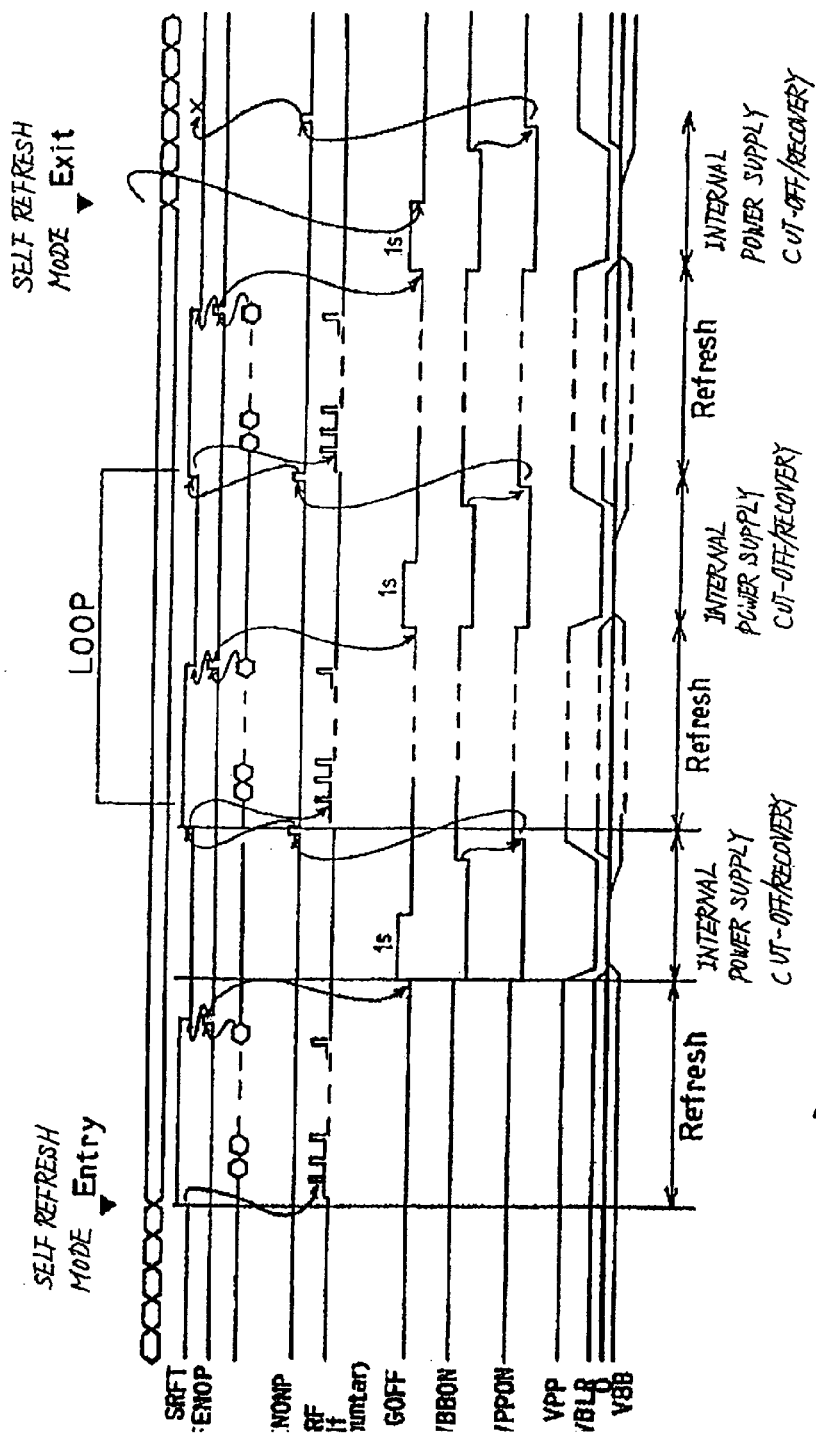
FIG. 12 is a flow chart illustrating a processing procedure for the semiconductor memory device according to the present invention.

As illustrated in FIG. 12, in the aforementioned self refresh mode (Entry), the semiconductor memory device repeatedly performs a refresh operation (Refresh) and stops the internal voltage generator circuits (internal power supply cut-off/recovery) at a predetermined cycle which is set in accordance with maximal data hold time tREFmax.

In refresh operation, refresh operation control circuit 42 first sets refresh operation signal SRTF to "H" for indicating that the semiconductor memory device is in a refresh operation period, and generates word line selection pulses PSRF for selecting word lines associated with the refresh operation. Mode control circuit 41 activates the respective word lines in order at a timing of word line selection pulse PSRF delivered from refresh operation control circuit 42 to read, amplify, and rewrite data held in memory cells for each word line. As the refresh operation is completed for all the word lines, refresh operation control circuit 42 switches refresh operation signal SRFT to "L" and delivers refresh end pulse REFENDP indicative of the terminated refresh operation.

As refresh operation signal SRFT is switched to "L", internal power supply control circuit 43 starts counting output pulses SLOSC from oscillator circuit 49 using a count circuit of internal power supply cut-off time measuring circuit 47, and generates internal power supply stop signal GOFF having a predetermined pulse width (1 sec in FIG. 12).

When internal power supply stop signal GOFF is at a significant value ("H"), VPP internal voltage generator circuit 11 for generating word line voltage VPP; VBB internal voltage generator circuit 12 for generating memory array substrate voltage VBB; VBLR internal voltage generator circuit 13 for generating bit line precharge voltage VBLR; and VDL internal voltage generator circuit 15 for generating bit line voltage VDL are inoperative to stop supplying their respective internal supply voltages. After this, the output terminal of VBB internal voltage generator circuit 12, and the word lines are connected to ground potential VSS, respectively.

Next, as internal power supply stop signal GOFF is switched to "L", VPP internal voltage generator circuit 11, VBB internal voltage generator circuit 12, VBLR internal voltage generator circuit 13, and VDL internal voltage generator circuit 15 resume their operations. Also, the output terminal of VBB internal voltage generator circuit 12 is disconnected from ground potential VSS, and word lines are likewise disconnected from ground potential VSS. Here, VPP internal voltage generator circuit 11 stops delivering word line voltage VPP until VBB rise completion signal VBBON supplied from VBB detector circuit 482 of internal power supply recovery circuit 48 goes to a significant value ("H").

As memory array substrate voltage VBB rises to some extent to recover the operation of VPP internal voltage generator circuit 11, VPP recovery determining circuit 481 in internal power supply recovery circuit 48 switches VPP recovery signal VPPON to a significant value ("H").

Upon detection of fully recovered word line voltage VPP through VPP recovery signal VPPON, refresh operation control circuit 42 generates recovery completion pulse GENONP, and switches refresh operation signal SRFT to "H" to resume the refresh operation.

The operation described above is repeated until the self refresh mode terminates (Exit).

As appreciated recognized, the semiconductor memory device in the first embodiment stops the operation of VPP internal voltage generator circuit 11 for generating word line voltage VPP; VBB internal voltage generator circuit 12 for generating memory array substrate voltage VBB; VBLR internal voltage generator circuit 13 for generating bit line precharge voltage VBLR; and VDL internal voltage generator circuit 15 for generating bit line voltage VDL, respectively, in a non-access period in which memory array unit 3 is not accessed, to cut off leak current flowing through bit lines and word lines, and leak currents flowing into loads of the stopped internal voltage generator circuits, thereby making it possible to reduce average current consumption of the semiconductor memory device.

Among a variety of internal voltage generator circuits, VPP internal voltage generator circuit 11 and VBB internal voltage generator circuit 12 have a problem of low voltage conversion efficiency due to the use of the charge pump circuits for generating a boosted voltage or a negative voltage. For example, a single-boost charge pump circuit has a conversion efficiency of 50% or less, and a double-boost charge pump circuit (used when external supply voltage VDD is further reduced to a lower voltage) has a conversion efficiency of 33% or less. It is therefore possible to reduce current components two to three times as much as leak currents flowing into loads of VPP internal voltage generator circuit 11 and VBB internal voltage generator circuit 12, when the semiconductor memory device stops the operation of these circuits.

By maintaining the operation of VPLT internal voltage generator circuit 14 for generating cell plate voltage VPLT, and VCL internal voltage generator circuit 16 for generating reduced voltage VCL supplied to peripheral circuits, and connecting the output terminal of VBB internal voltage generator circuit 12, and the word lines to ground potential VSS, respectively, while stopping VPP internal voltage generator circuit 11, VBB internal voltage generator circuit 12, VBLR internal voltage generator circuit 13, and VDL internal voltage generator circuit 15, transistors contained in memory cells can be prevented from malfunctioning to avoid corruption of data held in the memory cells.

Further, for recovering the operation of VPP internal voltage generator circuit 11, VBB internal voltage generator circuit 12, VBLR internal voltage generator circuit 13, and VDL internal voltage generator circuit 15, when the operation of VPP internal voltage generator circuit 11 is recovered after memory array substrate voltage VBB has risen, the transistors contained in the memory cells are prevented from malfunctioning to avoid corruption of data held in the memory cells.

While the foregoing description has been made for an embodiment which completely stops the operation of VPP internal voltage generator circuit 11, VBB internal voltage generator circuit 12, VBLR internal voltage generator circuit 13, and VDL internal voltage generator circuit 15 in a non-access period in which memory array unit 3 is not accessed, at least one of VPP internal voltage generator circuit 11, VBB internal voltage generator circuit 12, and VBLR internal voltage generator circuit 13 may be stopped to cut off a leak current flowing into a load thereof, thereby providing a further reduction in average current consumption than conventional semiconductor memory devices.

(Second Embodiment)

Figure 13:
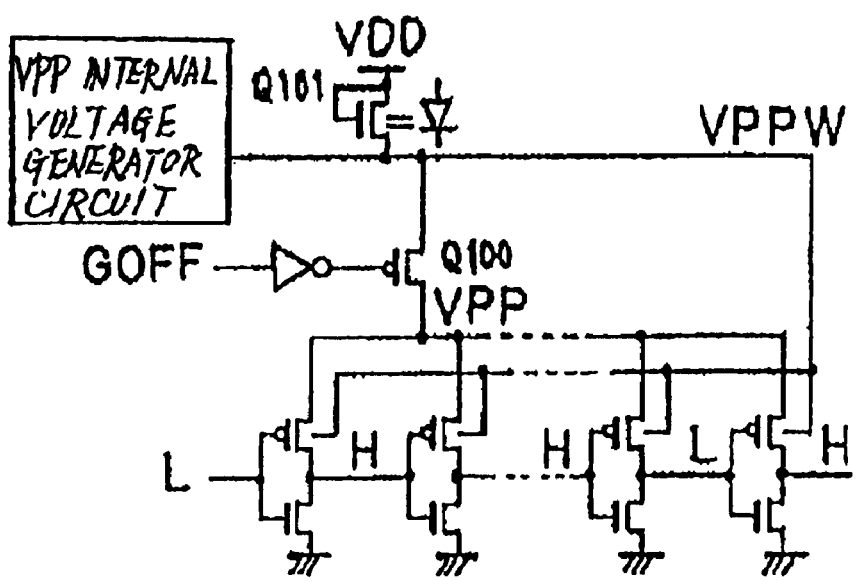
FIG. 13 is a circuit diagram illustrating the configuration of the semiconductor memory device according to the present invention in a second embodiment.

FIG. 13 illustrates the configuration of the semiconductor memory device according to the present invention in a second embodiment.

In the second embodiment, the operation of VPP internal voltage generator circuit 11 for generating word line voltage VPP is not stopped in response to internal power supply stop signal GOFF delivered from internal power supply control circuit 43. In addition, in the second embodiment, each of pMOS transistors contained in logical circuits and the like within the word driver and X decoder, which are supplied with word line voltage VPP, is supplied with word line voltage independently at its source and substrate, as illustrated in FIG. 13. Further, switching transistor Q100 is disposed between the output terminal of VPP internal voltage generator circuit 11 and the source of the pMOS transistor for disconnection therebetween. The remaining configuration of the semiconductor memory device in the second embodiment is similar to that of the first embodiment, so that description thereon is omitted.

The semiconductor memory device in the second embodiment turns OFF switch transistor Q100 to stop supplying only word line voltage VPP applied to the source of the pMOS transistor, while maintaining the supply of substrate voltage VPPW (≈VPP) as it is, during a non-access period in which memory array unit 3 is not accessed.

The configuration modified in the foregoing manner causes an apparent threshold voltage of the pMOS transistor to rise even without connecting word lines to ground potential VSS, while the internal voltage generator circuits are inoperative, thereby making it possible to prevent malfunctions. Further, an additional reduction is provided in a sub-threshold leak current of the pMOS transistors supplied with word line voltage VPP, resulting in a reduction in average current consumption of the semiconductor memory device.

When the operation of VPP internal voltage generator circuit 11 is stopped as is the case with the first embodiment, external supply voltage VDD may be supplied to the substrate of the pMOS transistors through nMOS transistor Q101 which is diode-connected as illustrated in FIG. 13. In this event, while substrate voltage VPPW is reduced to VDD−VTH (threshold voltage of Q101) when the operation of VPP internal voltage generator circuit 11 is stopped, the pMOS transistors can be prevented from malfunctions as is the aforementioned case where word line voltage VPP is supplied to the pMOS transistors.

While preferred embodiments of the present invention have been described using specific terms, such description is for illustrative purposes only, and it is to be understood that changes and variations may be made without departing from the spirit or scope of the following claims.

What is claimed is:

1. A method of controlling a semiconductor memory device which requires a refresh operation for holding data written in memory cells, said semiconductor memory device comprising:

a VPP internal voltage generator circuit for generating a word line voltage for use in driving a word line, said word line voltage being a boosted voltage higher than an external supply voltage supplied from the outside; and a VDL internal voltage generator circuit for generating a bit line voltage for use in driving a bit line, said bit line voltage being a reduced voltage lower than the external supply voltage supplied from the outside, said method comprising the step of:

cutting off a voltage output from said VPP internal voltage generator circuit for a predetermined period at the end of each said refresh operation.

2. The method of controlling a semiconductor memory device according to claim 1, further comprising the step of connecting said word line to a ground potential while said word line voltage is cut off from said VPP internal voltage generator circuit.

3. The method of controlling a semiconductor memory device according to claim 1, further comprising the step of cutting off a voltage output from said VDL internal voltage generator circuit for a predetermined period at the end of each said refresh operation.

4. A method of controlling a semiconductor memory device which requires a refresh operation for holding data written in memory cells, said semiconductor memory device comprising:

a VBB internal voltage generator circuit for generating a negative memory array substrate voltage supplied to a semiconductor substrate on which the memory cells are formed; and a VDL internal voltage generator circuit for generating a bit line voltage for use in driving a bit line, said bit line voltage being a reduced voltage lower than an external supply voltage supplied from the outside, said method comprising the step of:

cutting off a voltage output from said VBB internal voltage generator circuit for a predetermined period at the end of each said refresh operation.

5. The method of controlling a semiconductor memory device according to claim 4, further comprising the step of connecting an output terminal of said VBB internal voltage generator circuit to a ground potential while said memory array substrate voltage is cut off from said VBB internal voltage generator circuit.

6. The method of controlling a semiconductor memory device according to claim 4, further comprising the step of cutting off a voltage output from said VDL internal voltage generator circuit for a predetermined period at the end of each said refresh operation.

7. A method of controlling a semiconductor memory device which requires a refresh operation for holding data written in memory cells, said semiconductor memory device comprising:

a VPP internal voltage generator circuit for generating a word line voltage for use in driving a word line, said word line voltage being a boosted voltage higher than an external supply voltage supplied from the outside;

a VBB internal voltage generator circuit for generating a negative memory array substrate voltage supplied to a semiconductor substrate on which the memory cells are formed; and a VDL internal voltage generator circuit for generating a bit line voltage for use in driving a bit line, said bit line voltage being a reduced voltage lower than the external supply voltage supplied from the outside, said method comprising the steps of:
cutting off voltage outputs from said VPP internal voltage generator circuit and said VBB internal voltage generator circuit for a predetermined period at the end of each said refresh operation; and
delivering said word line voltage from said VPP internal voltage generator circuit after said memory array substrate voltage has risen, said memory array substrate voltage delivered from said VBB internal voltage generator circuit.

8. A method of controlling a semiconductor memory device which requires a refresh operation for holding data written in memory cells, said semiconductor memory device comprising a VBLR internal voltage generator circuit for generating a bit line precharge voltage for use in reproducing data held in the memory cells, said bit line precharge voltage being a reduced voltage lower than an external supply voltage supplied from the outside, said method comprising the step of:

cutting off a voltage output from said VBLR internal voltage generator circuit for a predetermined period at the end of each said refresh operation.

9. The method of controlling a semiconductor memory device according to claim 8, further comprising the step of cutting off a voltage output from said VDL internal voltage generator circuit for a predetermined period at the end of each said refresh operation.

10. A method of controlling a semiconductor memory device which requires a refresh operation for holding data written in memory cells, said semiconductor memory device comprising:

a VPP internal voltage generator circuit for generating a word line voltage for use in driving a word line, said word line voltage being a boosted voltage higher than an external supply voltage supplied from the outside;

a VDL internal voltage generator circuit for generating a bit line voltage for use in driving a bit line, said bit line voltage being a reduced voltage lower than the external supply voltage supplied from the outside;

a word driver comprising a plurality of MOS transistors each supplied with said word line voltage independently at a source and a substrate thereof for driving said word line; and a switch for cutting off only said word line voltage supplied to the source of each said MOS transistor, said method comprising the step of:
turning off said switch for a predetermined period at the end of each said refresh operation.

11. The method of controlling a semiconductor memory device according to claim 10, further comprising the step of cutting off a voltage output from said VDL internal voltage generator circuit for a predetermined period at the end of each said refresh operation.

12. A semiconductor memory device which requires a refresh operation for holding data written in memory cells, said semiconductor memory device comprising:

a VPP internal voltage generator circuit for generating a word line voltage for use in driving a word line, said word line voltage being a boosted voltage higher than an external supply voltage supplied from the outside, said VPP internal voltage generator circuit configured to deliver or stop said word line voltage in response to a predetermined control signal; and an internal power supply cut-off time measuring circuit for generating the control signal for cutting off the voltage output from said VPP internal voltage generator circuit for a predetermined period at the end of each said refresh operation.

13. The semiconductor memory device according to claim 12, further comprising a switch for connecting said word line to a ground potential while said word line voltage is cut off from said VPP internal voltage generator circuit.

14. The semiconductor memory device according to claim 12, further comprising:

a VDL internal voltage generator circuit for generating a bit line voltage for use in driving a bit line, said bit line voltage being a reduced voltage lower than the external supply voltage supplied from the outside, said VDL internal voltage generator circuit configured to deliver or stop said bit line voltage in response to the control signal delivered from said internal power supply cut-off time measuring circuit.

15. A semiconductor memory device which requires a refresh operation for holding data written in memory cells, said semiconductor memory device comprising:

a VBB internal voltage generator circuit for generating a negative memory array substrate voltage supplied to a semiconductor substrate on which said memory cells are formed, said VBB internal voltage generator circuit configured to deliver or stop said memory array substrate voltage in response to a predetermined control signal; and an internal power supply cut-off time measuring circuit for generating the control signal for cutting off the voltage output from said VBB internal voltage generator circuit for a predetermined period at the end of each said refresh operation.

16. The semiconductor memory device according to claim 15, further comprising an output control circuit for connecting an output terminal of said VBB internal voltage generator circuit to a ground potential while said memory array substrate voltage is cut off from said VBB internal voltage generator circuit.

17. The semiconductor memory device according to claim 15, further comprising:

a VDL internal voltage generator circuit for generating a bit line voltage for use in driving a bit line, said bit line voltage being a reduced voltage lower than the external supply voltage supplied from the outside, said VDL internal voltage generator circuit configured to deliver or stop said bit line voltage in response to the control signal delivered from said internal power supply cut-off time measuring circuit.

18. A semiconductor memory device which requires a refresh operation for holding data written in memory cells, said semiconductor memory device comprising:
   a VPP internal voltage generator circuit for generating a word line voltage for use in driving a word line, said word line voltage being a boosted voltage higher than an external supply voltage supplied from the outside, said VPP internal voltage generator circuit configured to deliver or stop said word line voltage in response to a predetermined control signal;
   a VBB internal voltage generator circuit for generating a negative memory array substrate voltage supplied to a semiconductor substrate on which said memory cells are formed, said VBB internal voltage generator circuit configured to deliver or stop said memory array substrate voltage in response to the predetermined control signal;
   an internal power supply cut-off time measuring circuit for generating the control signal for cutting off the voltage outputs from said VPP internal voltage generator circuit and said VBB internal voltage generator circuit, respectively, for a predetermined period at the end of each said refresh operation; and
   an internal power supply recovery circuit for delivering a control signal for controlling said VPP internal voltage generator circuit to deliver said word line voltage after said memory array substrate voltage has risen, said memory array substrate voltage delivered from said VBB internal voltage generator circuit.

19. A semiconductor memory device which requires a refresh operation for holding data written in memory cells, said semiconductor memory device comprising:
   a VBLR internal voltage generator circuit for generating a bit line precharge voltage for use in reproducing data held in said memory cells, said bit line precharge voltage being a reduced voltage lower than an external supply voltage supplied from the outside, said VBLR internal voltage generator circuit configured to deliver or stop said bit line precharge voltage in response to a predetermined control signal; and
   an internal power supply cut-off time measuring circuit for generating the control signal for cutting off a voltage output from said VBLR internal voltage generator circuit for a predetermined period at the end of each said refresh operation.

20. The semiconductor memory device according to claim 19, further comprising:
   a VDL internal voltage generator circuit for generating a bit line voltage for use in driving a bit line, said bit line voltage being a reduced voltage lower than the external supply voltage supplied from the outside, said VDL internal voltage generator circuit configured to deliver or stop said bit line voltage in response to the control signal delivered from said internal power supply cut-off time measuring circuit.

21. A semiconductor memory device which requires a refresh operation for holding data written in memory cells, said semiconductor memory device comprising:
   a VPP internal voltage generator circuit for generating a word line voltage for use in driving a word line, said word line voltage being a boosted voltage higher than an external supply voltage supplied from the outside;
   a word driver comprising a plurality of MOS transistors each supplied with said word line voltage independently at a source and a substrate thereof for driving said word line;
   a switch for cutting off only said word line voltage supplied to the source of each said MOS transistor; and
   an internal power supply cut-off time measuring circuit for generating a control signal for turning off said switch for a predetermined period at the end of each said refresh operation.

22. The semiconductor memory device according to claim 21, further comprising:
   a VDL internal voltage generator circuit for generating a bit line voltage for use in driving a bit line, said bit line voltage being a reduced voltage lower than the external supply voltage supplied from the outside, said VDL internal voltage generator circuit configured to deliver or stop said bit line voltage in response to the control signal delivered from said internal power supply cut-off time measuring circuit.

* * * * *